(12) United States Patent
Takahashi

(10) Patent No.: US 11,036,138 B2
(45) Date of Patent: Jun. 15, 2021

(54) SUBSTRATE PROCESSING APPARATUS, SUBSTRATE PROCESSING METHOD, AND COMPUTER-READABLE RECORDING MEDIUM

(71) Applicant: TOKYO ELECTRON LIMITED, Tokyo (JP)

(72) Inventor: Teppei Takahashi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/182,665

(22) Filed: Nov. 7, 2018

(65) Prior Publication Data
US 2019/0146345 A1 May 16, 2019

(30) Foreign Application Priority Data
Nov. 14, 2017 (JP) .............................. JP2017-219073

(51) Int. Cl.
*G03F 7/16* (2006.01)
*H01L 21/027* (2006.01)
*H01L 21/67* (2006.01)

(52) U.S. Cl.
CPC ............. *G03F 7/162* (2013.01); *G03F 7/168* (2013.01); *H01L 21/0273* (2013.01); *H01L 21/6715* (2013.01); *H01L 21/67051* (2013.01); *H01L 21/67178* (2013.01)

(58) Field of Classification Search
CPC ................ B05D 1/005; H01L 21/6715; H01L 21/67051; H01L 21/0273; H01L 21/67178; G03F 7/162; G03F 7/168
USPC ........................................................ 427/240
See application file for complete search history.

(56) References Cited

U.S. PATENT DOCUMENTS

| | | | | |
|---|---|---|---|---|
| 5,939,139 A | * | 8/1999 | Fujimoto | B05C 11/08 427/240 |
| 5,952,050 A | * | 9/1999 | Doan | B05D 1/005 118/52 |
| 6,117,486 A | * | 9/2000 | Yoshihara | G03F 7/162 427/240 |
| 2003/0077083 A1 | * | 4/2003 | Yamamoto | G03F 7/3021 396/611 |
| 2003/0077523 A1 | * | 4/2003 | Hata | G03F 7/168 430/5 |
| 2016/0372320 A1 | * | 12/2016 | Emoto | H01L 21/68728 |

FOREIGN PATENT DOCUMENTS

JP      H11283899 A      10/1999

* cited by examiner

*Primary Examiner* — Nathan T Leong
(74) *Attorney, Agent, or Firm* — Nath, Goldberg & Meyer; Jerald L. Meyer

(57) ABSTRACT

There is provided a substrate processing apparatus which includes: a rotation holding part configured to hold a substrate and rotate the substrate at a predetermined rotation speed around a rotation axis which extends in a direction perpendicular to a front surface of the substrate; a processing liquid supply part provided with a processing liquid nozzle located in proximity of the front surface and configured to supply a processing liquid onto the front surface from the processing liquid nozzle; a solvent supply part provided with at least one discharge nozzle located in proximity of the front surface and configured to supply an organic solvent onto the front surface from the at least one discharge nozzle; and a controller configured to execute a first process and a second process.

6 Claims, 12 Drawing Sheets

SUBSTRATE PROCESSING APPARATUS, SUBSTRATE PROCESSING METHOD, AND COMPUTER-READABLE RECORDING MEDIUM

CROSS-REFERENCE TO RELATED APPLICATION

This application is based upon and claims the benefit of priority from Japanese Patent Application No. 2017-219073, filed on Nov. 14, 2017, the entire contents of which are incorporated herein by reference.

TECHNICAL FIELD

The present disclosure relates to a substrate processing apparatus, a substrate processing method, and a non-transitory computer-readable recording medium.

BACKGROUND

At present, in manufacturing a semiconductor device by micro-fabricating a substrate (for example, a semiconductor wafer), it is being widely practiced to form a concavo-convex pattern on a substrate by using a photolithography technique. For example, the step of forming a concavo-convex pattern on a substrate includes forming a resist film on the surface of a wafer, exposing the resist film along a predetermined pattern, developing the exposed resist film with a developing liquid to form a resist pattern, and etching the substrate through the resist pattern.

When forming a resist film on the surface of a wafer, for example, a spin coating method is adopted. The spin coating method is a method of discharging a resist liquid onto the surface of a rotating substrate, thereby spreading the resist liquid by a centrifugal force to coat the entire surface of the substrate with the resist liquid. According to the spin coating method, the resist liquid may go around from the peripheral edge of the substrate to the back surface of the substrate at the time of coating with the resist liquid. This is because when the substrate is rotated at a high speed, a negative pressure is generated on the back surface of the substrate, thereby generating an air flow toward the center axis on the back surface of the substrate. In this connection, there has been proposed a technique for forming a vent hole in a base member opposed to the back surface of the substrate. According to this technique, since air flows through the vent hole, it is possible to suppress a negative pressure from being generated on the back surface of the substrate.

In recent years, in manufacturing MEMS (MicroElectro Mechanical Systems) or the like, in some cases, a thick resist film (resist thick film) having a thickness of, for example, about 5 μm to 60 μm is formed on the surface of a substrate in order to three-dimensionally machine the substrate. The resist thick film may be made of a material such as a coating liquid (for example, polyimide) which has high viscosity and hardly flows on the surface of the substrate. The viscosity of such a coating liquid is, for example, about 2,000 cP or more.

When the coating liquid is dropped onto the surface of the substrate and the substrate is spin-coated in a state where the substrate is rotated at a high speed to some extent, the entire surface of the substrate is coated with the coating liquid, thereby enhancing the uniformity of the film thickness of the coating film. However, since most of the coating liquid is shaken off outward from the outer peripheral edge of the substrate, it is difficult to make the film thickness of the formed coating a desired size.

On the other hand, in order to obtain a thick resist film, when the coating liquid is dropped onto the surface of the substrate and the substrate is spin coated in a state where the substrate is rotated at a low speed to some extent, some of the coating film is shaken off from the outer peripheral edge of the substrate. Since the coating liquid has high viscosity, the coating film shaken off from the outer peripheral edge of the substrate is stretched in a string shape from the outer peripheral edge, thereby forming a string-like portion extending radially outward from the outer peripheral edge. In this process, the coating film and the string-like portion are gradually dried and gelled. The gelled string-like portions hang downward from the substrate and are entangled with each other to form a cotton-like mass (hereinafter referred to as a "floc").

In a conventional cleaning apparatus, since the negative pressure is suppressed from being generated on the back surface of the substrate, the gelled string-like portions are suppressed from being entangled with each other on the back surface of the substrate. However, since the occurrence of floc itself cannot be prevented, periodic maintenance is required to remove such a floc.

SUMMARY

Some embodiments of the present disclosure provide a substrate processing apparatus, a substrate processing method and a non-transitory computer-readable recording medium which are capable of suppressing the occurrence of floc.

According to one embodiment of the present disclosure, there is provided a substrate processing apparatus including: a rotation holding part configured to hold a substrate and rotate the substrate at a predetermined rotation speed around a rotation axis which extends in a direction perpendicular to a front surface of the substrate; a processing liquid supply part provided with a processing liquid nozzle located in proximity of the front surface and configured to supply a processing liquid onto the front surface from the processing liquid nozzle; a solvent supply part provided with at least one discharge nozzle located in proximity of the front surface and configured to supply an organic solvent onto the front surface from the at least one discharge nozzle; and a controller configured to execute: a first process of controlling the rotation holding part and the processing liquid supply part to supply the processing liquid onto the front surface from the processing liquid nozzle while the substrate is being rotated by the rotation holding part; and a second process of controlling the solvent supply part to discharge the organic solvent downward from the at least one discharge nozzle outside an outer peripheral edge of the substrate before the processing liquid reaches the outer peripheral edge of the substrate by virtue of a centrifugal force generated with the rotation of the substrate.

According to another embodiment of the present disclosure, there is provided a method of processing a substrate, including: rotating the substrate at a predetermined rotation speed around a rotation axis which extends in a direction perpendicular to a front surface of the substrate and supplying a processing liquid onto the front surface from a processing liquid nozzle located above the substrate; discharging an organic solvent downward from a discharge nozzle located above the substrate outside an outer peripheral edge of the substrate, before the processing liquid reaches the outer peripheral edge of the substrate by virtue of a centrifugal force generated with the rotation of the substrate.

According to another embodiment of the present disclosure, there is provided a non-transitory computer-readable storage medium storing a program that causes a substrate processing apparatus to execute the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
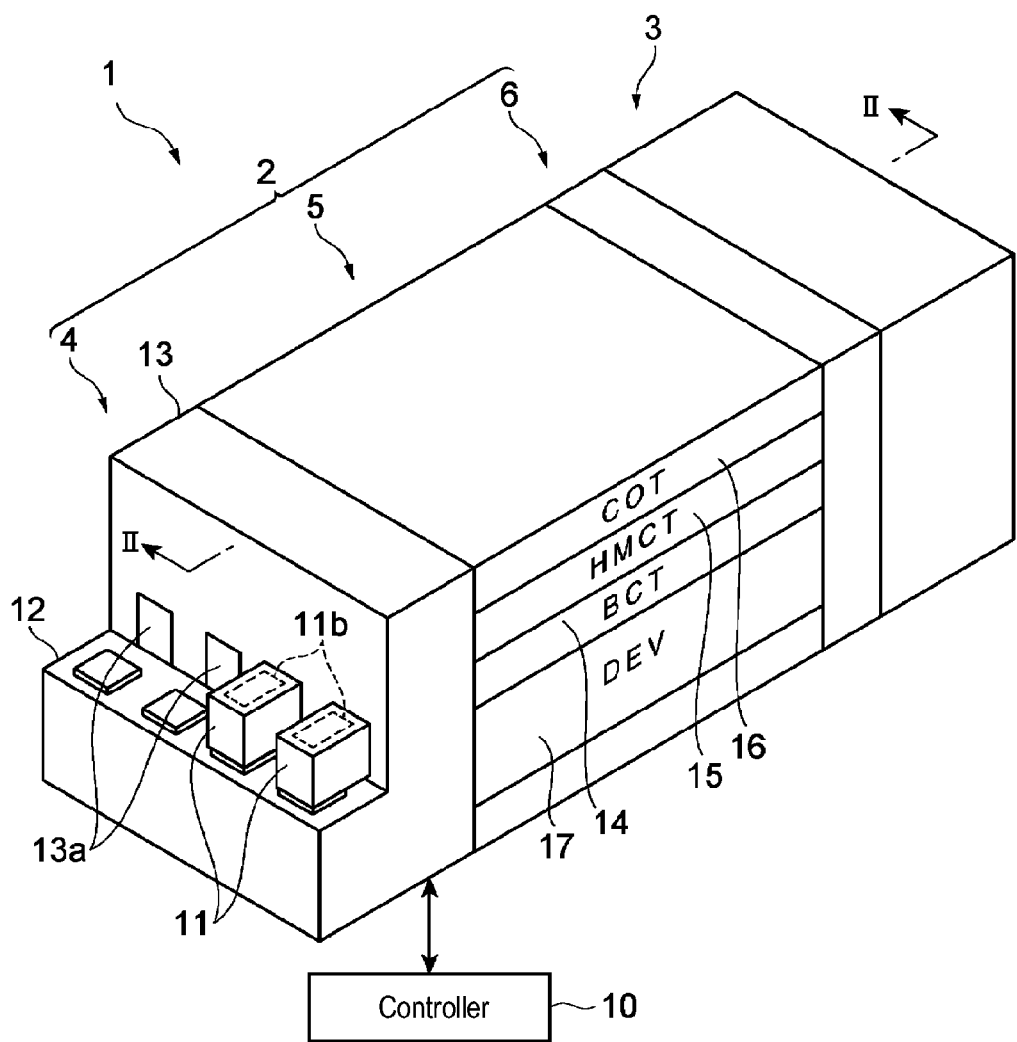
FIG. 1 is a perspective view illustrating a substrate processing system.

Embodiments according to the present disclosure described below are provided to illustratively explain the present disclosure. Thus, the present disclosure is not limited to the following detailed description. Throughout the detailed description and the drawings, the same elements or elements having the same function are denoted by the same reference numerals and description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

As illustrated in FIG. 1, a substrate processing system 1 (substrate processing apparatus) includes a coating/developing apparatus 2 (substrate processing apparatus) and a controller 10 (control part). The substrate processing system 1 further includes an exposing apparatus 3. The exposing apparatus 3 includes a controller (not shown) capable of communicating with the controller 10 of the substrate processing system 1. The exposing apparatus 3 is configured to exchange a wafer W (substrate) with the coating/developing apparatus 2 and perform an exposing process (pattern exposure) on a photosensitive resist film formed on a front surface Wa of the wafer W (see FIG. 4 or the like). Specifically, the exposing apparatus 3 selectively irradiates an energy beam onto an exposure target portion of the photosensitive resist film (photosensitive film) by a method such as immersion exposure. An example of the energy beam may include an ArF excimer laser, a KrF excimer laser, g-ray, i-ray, or extreme ultraviolet (EUV).

Figure 10A:
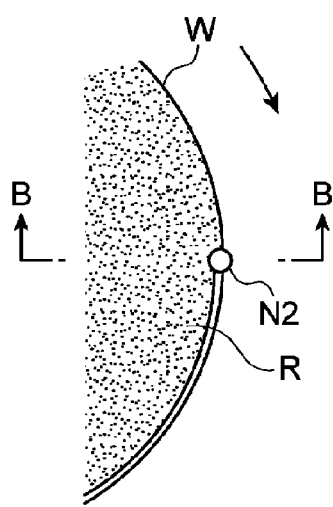
FIGS. 10A and 10B are schematic views for explaining a wafer processing procedure.
Figure 10B:
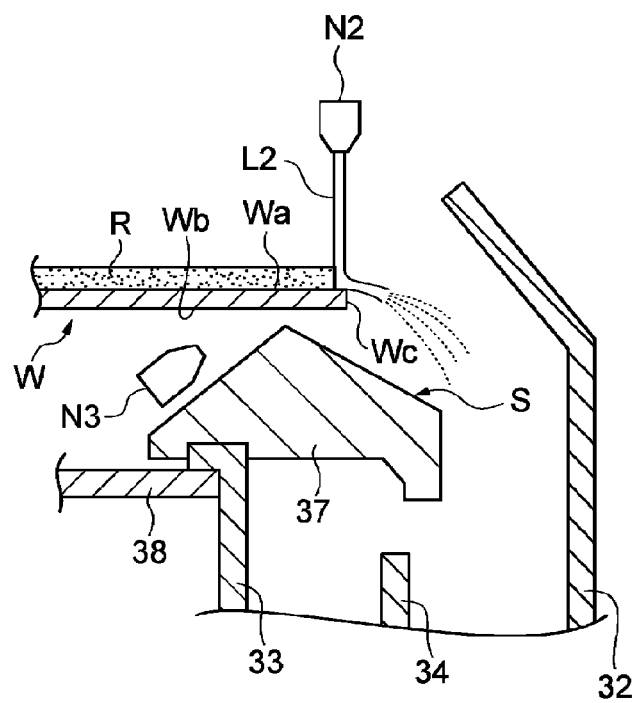

The coating/developing apparatus 2 performs a process of forming a resist film R (see FIGS. 10A and 10B) on the front surface Wa of the wafer W before the exposing process by the exposing apparatus 3. The resist film R includes a photosensitive resist film and a non-photosensitive resist film. The coating/developing apparatus 2 performs a process of developing the photosensitive resist film which has been subjected to the exposing process by the exposing apparatus 3.

The wafer W may have a disk shape, or a plate shape other than a circle, such as a polygon. The wafer W may have a cut-out portion. That is to say, a portion of the wafer W may be cut out. The cut-out portion may be, for example, a notch (a groove of a U shape, a V shape or the like), or a linearly-extending linear portion (so-called orientation flat). The wafer W may be, for example, a semiconductor substrate, a glass substrate, a mask substrate, an FPD (Flat Panel Display) substrate, or other various substrates. The diameter of the wafer W may be, for example, about 200 mm to 450 mm.

Figure 2:
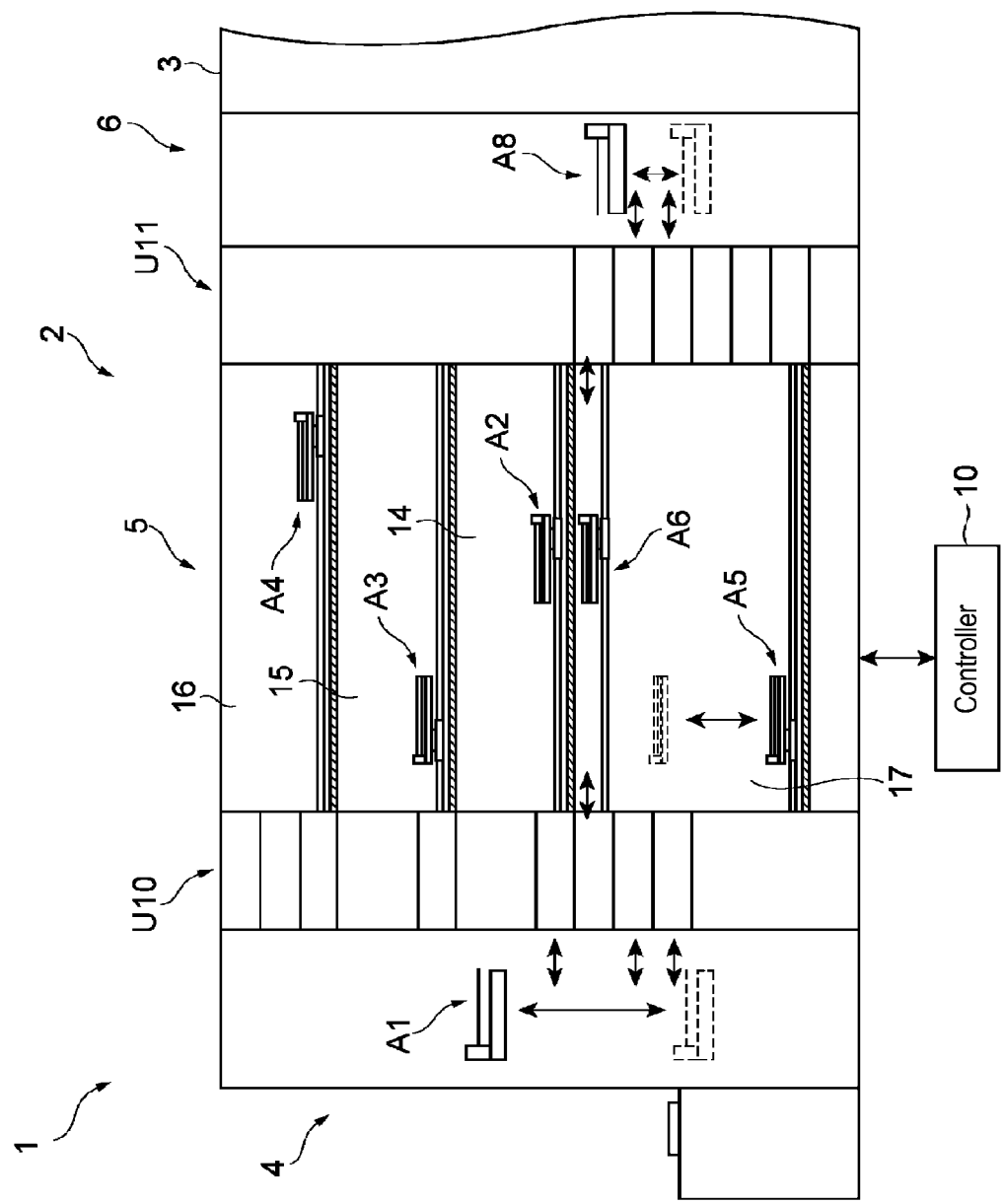
FIG. 2 is a cross-sectional view taken along line II-II in FIG. 1.
Figure 3:
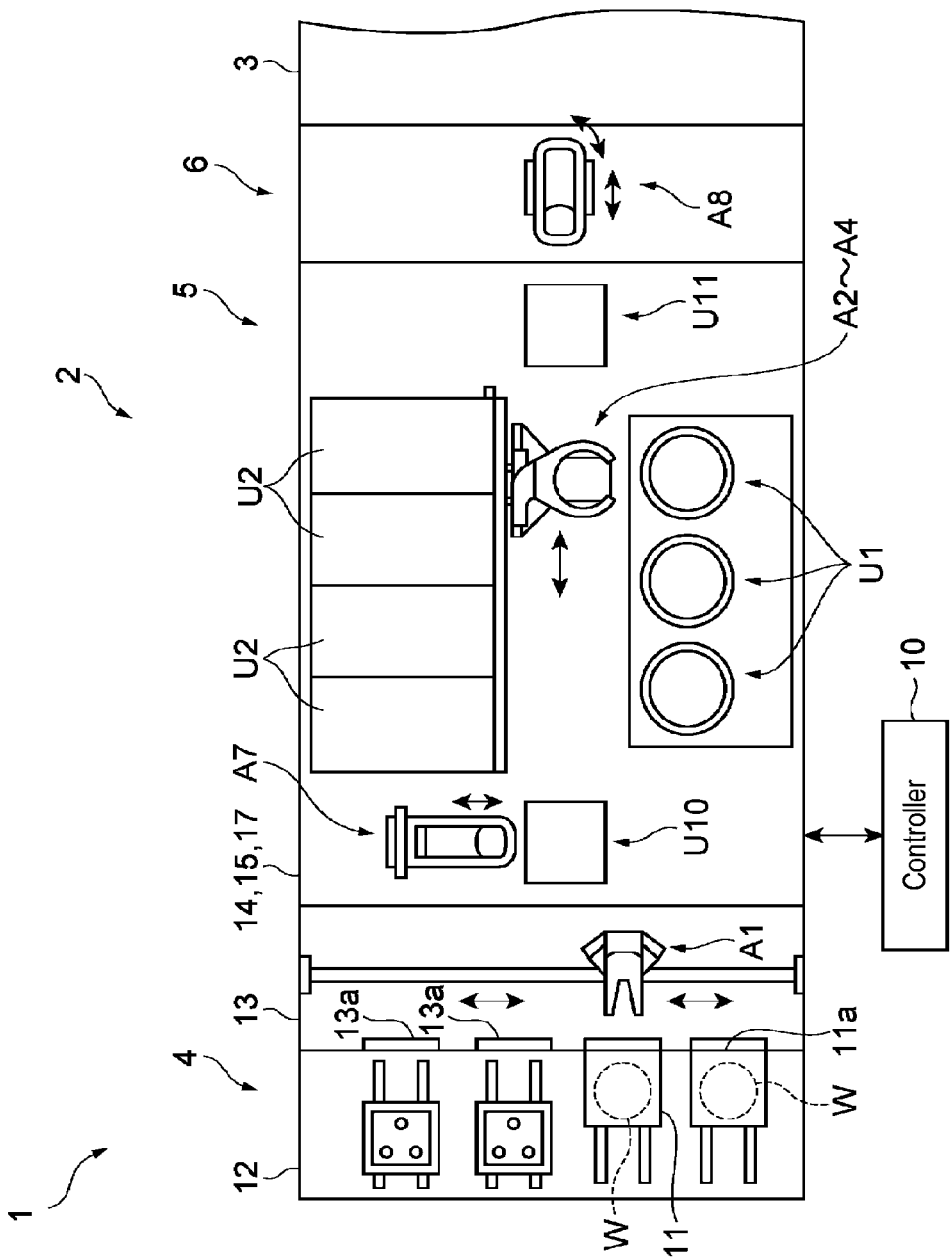
FIG. 3 is a top view illustrating unit processing blocks (BCT block, HMCT block, COT book and DEV block).

As illustrated in FIGS. 1 to 3, the coating/developing apparatus 2 includes a carrier block 4, a processing block 5 and an interface block 6. The carrier block 4, the processing block 5 and the interface block 6 are arranged in the horizontal direction.

As illustrated in FIGS. 1 and 3, the carrier block 4 includes a carrier station 12 and a loading/unloading part 13. The carrier station 12 supports a plurality of carriers 11. Each of the carriers 11 accommodates at least one wafer W in a sealed state. An opening/closing door (not shown) through which the wafer W is transferred is installed in a lateral surface 11a of the carrier 11. The carrier 11 is detachably installed on the carrier station 12 so that the lateral surface 11a faces the loading/unloading part 13.

The loading/unloading unit 13 is located between the carrier station 12 and the processing block 5. The loading/unloading part 13 includes a plurality of opening/closing doors 13a. When the carrier 11 is mounted on the carrier station 12, the opening/closing door of the carrier 11 faces the opening/closing door 13a. The opening/closing door 13a and the opening/closing door of the lateral surface 11a are opened at the same time so that the interior of the carrier 11 and the interior of the loading/unloading part 13 are in communication with each other. The loading/unloading part 13 includes a transfer arm A1 incorporated therein. The transfer arm A1 takes out the wafer W from the carrier 11 and delivers the same to the processing block 5. Further, the transfer arm A1 receives the wafer W from the processing block 5 and returns the same to the carrier 11.

The processing block 5 includes unit processing blocks 14 to 17, as illustrated in FIGS. 1 and 2. The unit processing block 17, the unit processing block 14, the unit processing block 15 and the unit processing block 16 are arranged in the named order from the bottom. As illustrated in FIG. 3, each of the unit processing blocks 14 to 17 includes a liquid treatment unit U1 (substrate processing apparatus) and a heat treatment unit U2 (heating part).

Figure 4:
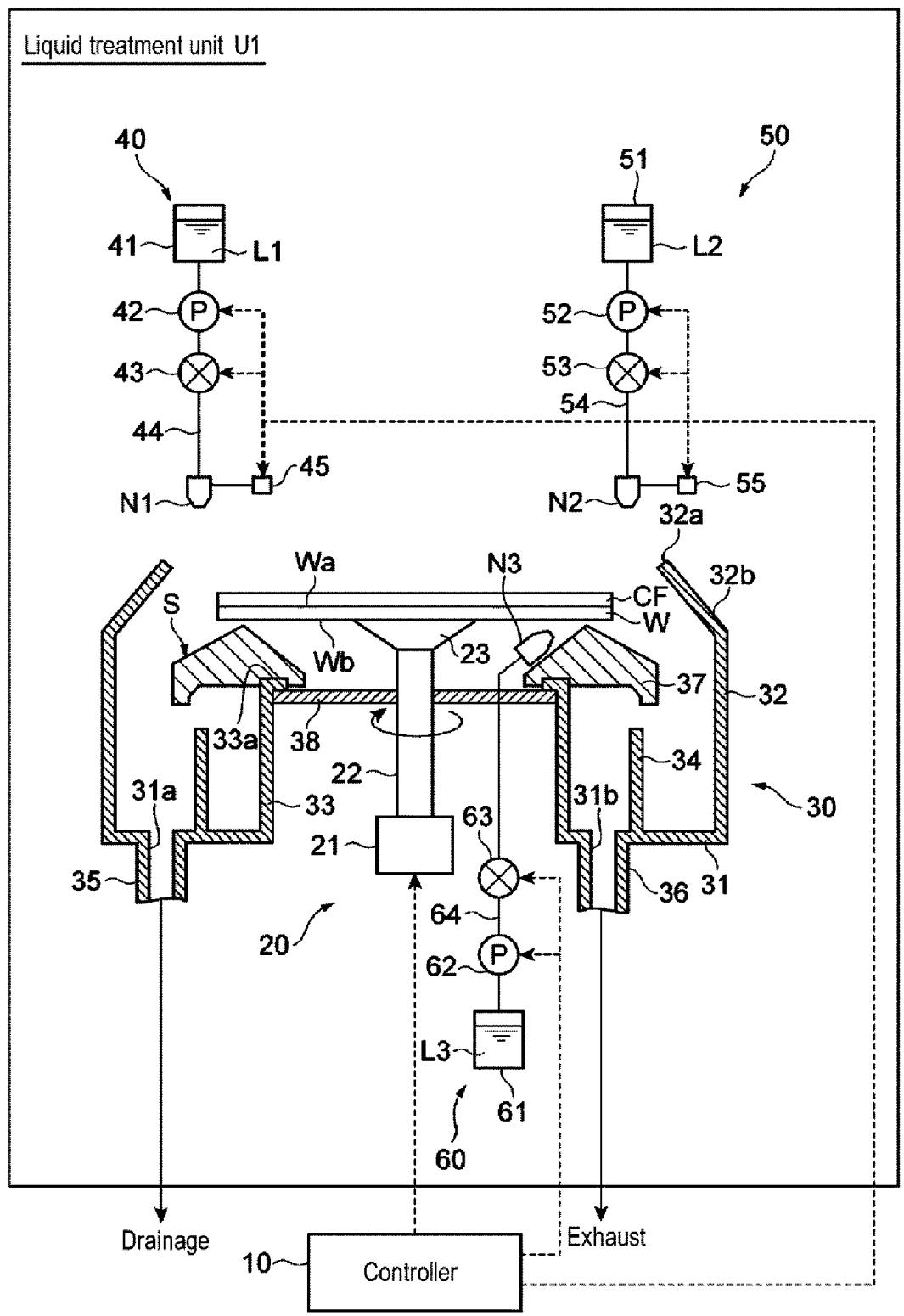
FIG. 4 is a view illustrating a liquid treatment unit.

The liquid treatment unit U1 is configured to supply various kinds of treatment liquids or gases onto the front surface Wa or a back surface Wb of the wafer W (see FIG. 4 or the like). The heat treatment unit U2 is configured to perform a heat treatment of heating the wafer W by, for example, a heating plate, and cooling the wafer W heated thus by, for example, a cooling plate.

The unit processing block 14 is an underlying film forming block (BCT block) configured to form an underlying film on the front surface Wa of the wafer W. The unit processing block 14 includes a transfer arm A2 for transferring the wafer W to each of the units U1 and U2 (see FIG. 2). The liquid treatment unit U1 of the unit processing block 14 forms a coating film by coating a coating liquid for forming the underlying film on the front surface Wa of the wafer W. The heat treatment unit U2 of the unit processing block 14 performs various heat treatments related to the formation of the underlying film. A specific example of the heat treatment may include a heating treatment of curing a coating film to form an underlying film. An example of the underlying film may include an anti-reflective (SiARC) film.

The unit processing block 15 is an intermediate film (hard mask) forming block (HMCT block) configured to form an intermediate film on an underlying film. The unit processing block 15 includes a transfer arm A3 for transferring the wafer W to each unit U1 and U2 (see FIG. 2). The liquid treatment unit U1 of the unit processing block 15 forms a coating film by coating a coating liquid for forming the intermediate film on the underlying film. The heat treatment unit U2 of the unit processing block 15 performs various heat treatments related to the formation of the intermediate film. A specific example of the heat treatment may include a heating treatment of curing a coating film to form an intermediate film. An example of the intermediate film may include an SOC (Spin On Carbon) film or an amorphous carbon film.

The unit processing block 16 is a resist film forming block (COT block) configured to form a thermosetting resist film R on the intermediate film. The unit processing block 16 includes a transfer arm A4 for transferring the wafer W to each unit U1 and U2 (see FIG. 2). The liquid treatment unit U1 of the unit processing block 16 forms a coating film CF (processing film) by coating, on the intermediate film, a coating liquid (resist agent) for forming a resist film (see FIG. 4 or the like). The heat treatment unit U2 of the unit processing block 16 performs various heat treatments related to the formation of the resist film R (cured film). A specific example of the heat treatment may include a heating treatment (PAB: Pre Applied Bake) for curing the coating film CF to form the resist film R.

The unit processing block 17 is a developing block (DEV block) configured to perform a developing process on the exposed resist film. The unit processing block 17 includes a transfer arm A5 for transferring the wafer W to each unit U1 and U2, and a direct transfer arm A6 for transferring the wafer W without passing through these units (see FIG. 2). The liquid treatment unit U1 of the unit processing block 17 supplies a developing liquid onto the exposed resist film R to develop the resist film R. The liquid treatment unit U1 of the unit processing block 17 supplies a rinse liquid onto the developed resist film R to wash away dissolved components of the resist film together with the developing liquid. As a result, the resist film R is partially removed to form a resist pattern. The heat treatment unit U2 of the unit processing block 16 performs various heat treatments related to the developing process. A specific example of the heat treatment may include a heating treatment (PEB: Post Exposure Bake) before the developing process, a heating treatment (PB: Post Bake) after the developing process, or the like.

As illustrated in FIGS. 2 and 3, a shelf unit U10 is installed at the side of the carrier block 4 in the processing block 5. The shelf unit U10 is installed to extend from the bottom to the unit processing block 16 and is partitioned into plural cells arranged in the vertical direction. An elevating arm A7 is installed in the vicinity of the shelf unit U10. The elevating arm A7 moves the wafer W up and down between the plural cells of the shelf unit U10.

A shelf unit U11 is installed at the side of the interface block 6 in the processing block 5. The shelf unit U11 is installed to extend from the bottom to an upper portion of the unit processing block 17 and is partitioned into plural cells arranged in the vertical direction.

The interface block 6 includes a transfer arm A8 and is connected to the exposing apparatus 3. The transfer arm A8 takes out the wafer W of the shelf unit U11 and delivers the same to the exposing apparatus 3. Further, the transfer arm A8 receives the wafer W from the exposing apparatus 3 and returns the same to the shelf unit U11.

The controller 10 partially or wholly controls the substrate processing system 1. Details of the controller 10 will be described later. The controller 10 is capable of exchanging signals with a controller of the exposing apparatus 3. The substrate processing system 1 and the exposing apparatus 3 are controlled in cooperation between the controller of the exposing apparatus 3 and the controller 10 of the substrate processing system 1.

[Configuration of Liquid Treatment Unit]

Next, the liquid treatment unit U1 will be described in more detail with reference to FIG. 4. The liquid treatment unit U1 includes a rotation holding part 20, a cup 30, a coating liquid supply part 40 (processing liquid supply part), a solvent supply part 50 and a cleaning liquid supply part 60.

The rotation holding part 20 includes a rotation part 21, a shaft 22 and a holder 23. The rotation part 21 is operated based on an operation signal provided from the controller 10 and rotates the shaft 22. The rotation part 21 is a power source such as an electric motor. The holder 23 is installed at a leading end of the shaft 22. The wafer W is mounted on the holder 23. The holder 23 holds the wafer W in a substantially horizontal posture, for example, by adsorption. That is to say, in a state where the wafer W is held in a substantial horizontal posture, the rotation holding part 20 rotates the wafer W around a rotation axis Ax perpendicular to the front surface Wa of the wafer W. In the present embodiment, the rotation axis Ax passes through substantially the center of the wafer W having a circular shape. Thus, the rotation axis Ax also serves as the center axis. In the present embodiment, as illustrated in FIG. 4, the rotation holding part 20 rotates the wafer W at a predetermined rotation speed in a clockwise direction when viewed from above. The number of rotations of the wafer W may be, for example, about 10 rpm to about 2,000 rpm.

The cup 30 is installed around the rotation holding part 20. The cup 30 functions as a liquid collecting vessel for receiving a liquid supplied onto the wafer W to process the wafer W. The cup 30 may be made of, for example, polypropylene (PP), polyvinylchloride (PVC), polyphenylenesulfide (PPS) resin, or the like. The cup 30 includes a bottom wall 31, an outer peripheral wall 32, an inner peripheral wall 33, a partition wall 34, a drain pipe 35, an exhaust pipe 36, an inclined wall 37 (inner wall portion) and a partition wall 38.

The bottom wall 31 has an annular shape so as to surround the rotation holding part 20. The outer peripheral wall 32 has a cylindrical shape so as to surround the wafer W held on the rotation holding part 20 and the inner peripheral wall 33. The outer peripheral wall 32 extends vertically upward from an outer peripheral edge of the bottom wall 31. The outer peripheral wall 32 is located outward of a peripheral edge of the wafer W held on the rotation holding part 20. Therefore, the outer peripheral wall 32 has a function of preventing scattering of a liquid from the wafer W which is rotating while being held by the rotation holding part 20. A portion of an upper end 32a of the outer peripheral wall 32 constitutes an inclined wall 32b that is inclined inward (toward the rotation holding part 20) as it goes upward.

The inner peripheral wall 33 has a cylindrical shape so as to surround the rotation holding part 20. The inner peripheral wall 33 extends vertically upward from an inner peripheral edge of the bottom wall 31. The inner peripheral wall 33 is located inward of the peripheral edge of the wafer W held on the rotation holding part 20. An upper end portion 33a of the inner peripheral wall 33 is closed by the partition wall 38. A through-hole is formed in the central portion of the partition wall 38. The shaft 22 is inserted through the through-hole.

The partition wall 34 has a cylindrical shape. The partition wall 34 extends vertically upward from the bottom wall 31 at a position between the outer peripheral wall 32 and the inner peripheral wall 33. That is to say, the partition wall 34 surrounds the inner peripheral wall 33.

The drain pipe 35 is connected to a liquid discharge hole 31a formed in the bottom wall 31 between the outer peripheral wall 32 and the partition wall 34. The exhaust pipe 36 is connected to a gas discharge hole 31b formed in the bottom wall 31 between the partition wall 34 and the inner peripheral wall 33.

The inclined wall 37 is attached to the upper end portion 33a of the inner peripheral wall 33 so as to protrude more outward than the partition wall 34. The inclined wall 37 has an umbrella shape (mountain shape) that protrudes upward. That is to say, the inclined wall 37 has an inclined surface S that is inclined downward and going outward in the radial direction of the rotation shaft of the rotation holding part 20. The inclined surface S faces the peripheral edge portion of the wafer W held on the rotation holding part 20. Therefore, a liquid dropped from the wafer W flows along the inclined surface S, is guided between the outer peripheral wall 32 and the partition wall 34, and is discharged through the liquid discharge hole 31a and the drain pipe 35.

The coating liquid supply part 40 is configured to supply a coating liquid L1 (processing liquid) onto the front surface Wa of the wafer W. An example of the coating liquid L1 may include a photosensitive resist material for forming a photosensitive resist film, a non-photosensitive resist material for forming a non-photosensitive resist film, or the like. For example, in order to form a thick resist film R having a film thickness of about 5 μm to 60 μm, a material (e.g., polyimide) which has a high viscosity and hardly flows on the front surface Wa of the wafer W may be used as the coating liquid L1. The lower limit of the viscosity of the coating liquid L1 may be, for example, about 2,000 cP, about 3,000 cP, ultimately about 4,000 cP. The upper limit of the viscosity of the coating liquid L1 may be, for example, about 7,000 cP, about 6,000 cP, ultimately about 5,000 cP.

The coating liquid supply part 40 includes a liquid source 41, a pump 42, a valve 43, a nozzle N1 (processing liquid nozzle), a pipe 44 and a driving mechanism 45. The liquid source 41 functions as a supply source of the coating liquid L1. The pump 42 is operated based on an operation signal provided from the controller 10, sucks the coating liquid L1 from the liquid source 41, and sends the same to the nozzle N1 via the pipe 44 and the valve 43. The valve 43, which is installed between the pump 42 and the nozzle N1, opens and closes the pipe 44 based on an operation signal provided from the controller 10.

The nozzle N1 is disposed above the wafer W such that a discharge opening of the nozzle N1 faces the front surface Wa of the wafer W. The nozzle N1 is capable of discharging the coating liquid L1 feed from the pump 42 onto the front surface Wa of the wafer W. The pipe 44 connects the liquid source 41, the pump 42, the valve 43 and the nozzle N1 in this order from the upstream side. The driving mechanism 45 is operated based on an operation signal provided from the controller 10, and moves the nozzle N1 in horizontal and vertical directions. The driving mechanism 45 is, for example, a servomotor with an encoder, and may control a movement speed and movement position of the nozzle N1.

The solvent supply part 50 is configured to supply an organic solvent L2 onto the front surface Wa of the wafer W. The organic solvent L2 is a thinner selected from various kinds of thinners, for example, a thinner (OK73 thinner, available from Tokyo Ohka Kogyo Co., Ltd.) which is obtained by mixing propylene glycol monomethyl ether (PGME) of 70 mass % with propylene glycol monomethyl ether acetate (PGMEA) of 30 mass %, a thinner (available from JSR Corporation) which is obtained by mixing propylene glycol monomethyl ether acetate (PGMEA) of 70 mass % with cyclohexanone (CHN) of 30 mass %, a thinner obtained by mixing α-butyrolactone of 95 mass % with anisole of 5 mass %, cyclohexanone, acetone, C-260 (available from Merck KgaA Co., Ltd.), A-515 (available from AZ Electronic Materials Co., Ltd.), and the like.

The solvent supply part 50 includes a liquid source 51, a pump 52, a valve 53, a nozzle N2 (discharge nozzle), a pipe 54 and a driving mechanism 55. The liquid source 51 functions as a supply source of the organic solvent L2. The pump 52 is operated based on an operation signal provided from the controller 10, sucks the organic solvent L2 from the liquid source 51, and sends the same to the nozzle N2 via the pipe 54 and the valve 53. The valve 53, which is installed between the pump 52 and the nozzle N2, opens and closes the pipe 54 based on an operation signal provided from the controller 10.

The nozzle N2 is disposed above the wafer W such that a discharge opening of the nozzle N2 faces the front surface Wa of the wafer W. The nozzle N2 is capable of discharging the organic solvent L2 feed from the pump 52 onto the front surface Wa of the wafer W. A flow velocity of the organic solvent L2 discharged from the nozzle N2 may be, for example, about 2 m/sec to 10 m/sec. The pipe 54 connects the liquid source 51, the pump 52, the valve 53 and the nozzle N2 in this order from the upstream side. The driving mechanism 55 is operated based on an operation signal provided from the controller 10 and moves the nozzle N2 in horizontal and vertical directions. The driving mechanism 55 is, for example, a servomotor with an encoder, and may control a movement speed and movement position of the nozzle N2.

The cleaning liquid supply part 60 is configured to supply a cleaning liquid L3 onto the back surface Wb of the wafer W. The cleaning liquid L3 is, for example, a thinner selected from various kinds of thinners and may be the same as the organic solvent L2.

The cleaning liquid supply part 60 includes a liquid source 61, a pump 62, a valve 63, a nozzle N3 (cleaning liquid nozzle) and a pipe 64. The liquid source 61 functions as a supply source of the cleaning liquid L3. The pump 62 is operated based on an operation signal provided from the controller 10, sucks the cleaning liquid L3 from the liquid source 61, and sends the same to the nozzle N3 via the pipe 64 and the valve 63. The valve 63, which is installed between the pump 62 and the nozzle N3, opens and closes the pipe 64 based on an operation signal provided from the controller 10.

The nozzle N3 is disposed below the wafer W such that a discharge opening of the nozzle N3 faces the back surface Wb of the wafer W. More specifically, the discharge opening of the nozzle N3 is opened obliquely upward so as to face the side of the outer peripheral edge Wc of the wafer W. The nozzle N3 is capable of discharging the cleaning liquid L3 feed from the pump 62 onto the back surface Wb of the wafer W and toward the vicinity of the outer peripheral edge Wc. The pipe 64 connects the liquid source 61, the pump 62, the valve 63 and the nozzle N 3 in this order from the upstream side.

[Configuration of Controller]

Figure 5:
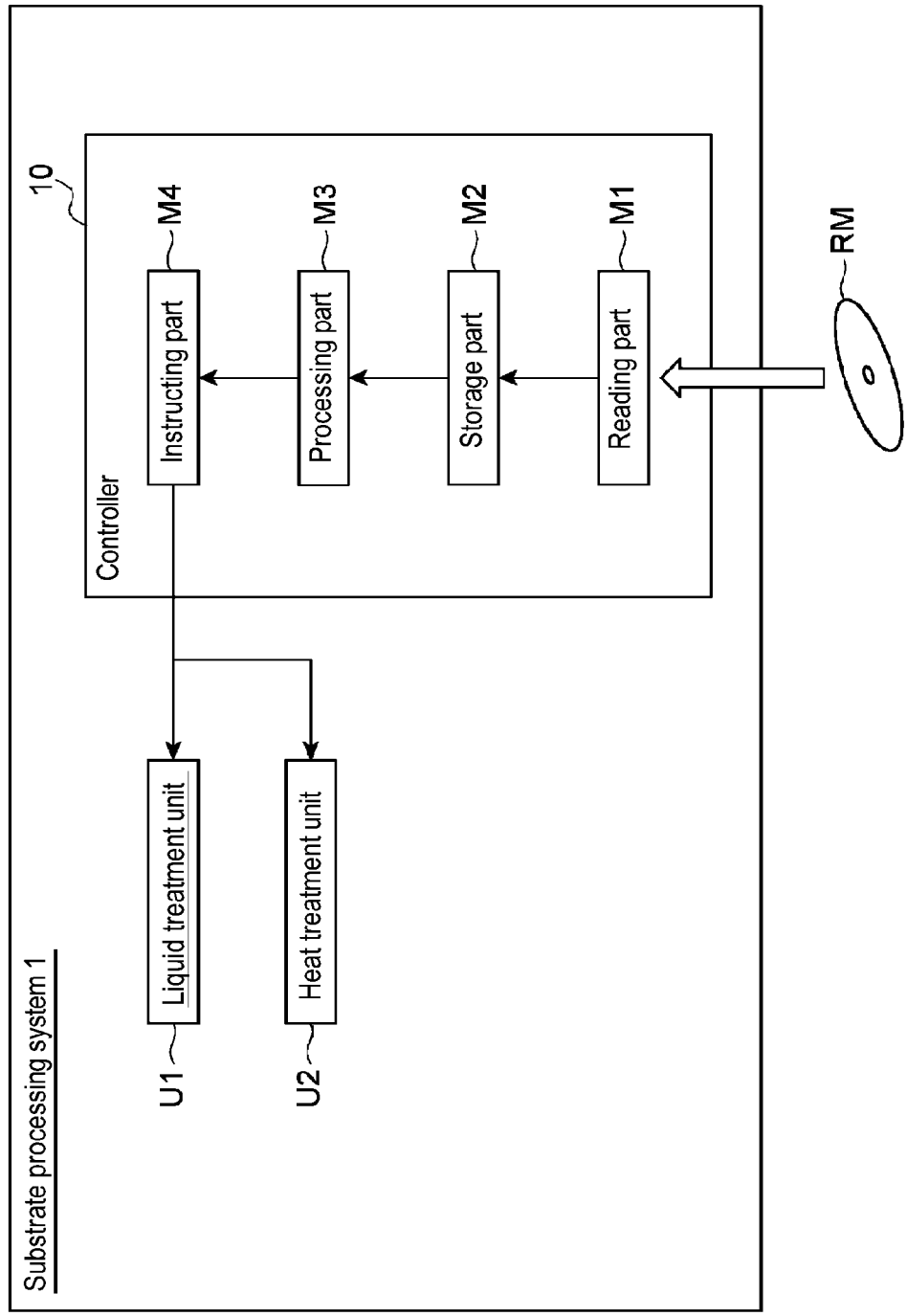
FIG. 5 is a block diagram illustrating main components of the substrate processing system.

As illustrated in FIG. 5, the controller 10 includes a reading part M1, a storage part M2, a processing part M3 and an instructing part M4 as a plurality of functional modules. Although the controller 10 has been described to be divided into the plurality of functional modules according to respective functions for the sake of convenience in description, it does not necessarily mean that the hardware constituting the controller 10 is divided into such modules. Each functional module is not limited to being realized by execution of a program, but may be realized by a dedicated electric circuit (for example, a logic circuit) or an ASIC (Application Specific Integrated Circuit) into which the functional modules are combined.

The reading part M1 reads a program from a computer-readable recording medium RM. The recording medium RM records a program for operating each part of the substrate processing system 1. The recording medium RM may be, for example, a semiconductor memory, an optical recording disk, a magnetic recording disk or a magneto-optical recording disk.

The storage part M2 stores various data. The storage part M2 stores, for example, the program read from the recording medium RM by the reading part M1, various data (so-called process recipe) used to process the wafer W, setting data inputted from an operator via an external input device (not shown), and the like.

The processing part M3 processes various data. The processing part M3 generates operation signals for operating the liquid treatment unit U1 (for example, the rotation holding part 20, the pumps 42, 52 and 62, the valves 43, 53 and 63, the driving mechanism 45 and 55, etc.) and the heat treatment unit U2, for example, based on the various data stored in the storage part M2.

The instructing part M4 transmits the operation signals generated in the processing part M3 to the respective devices.

Figure 6:
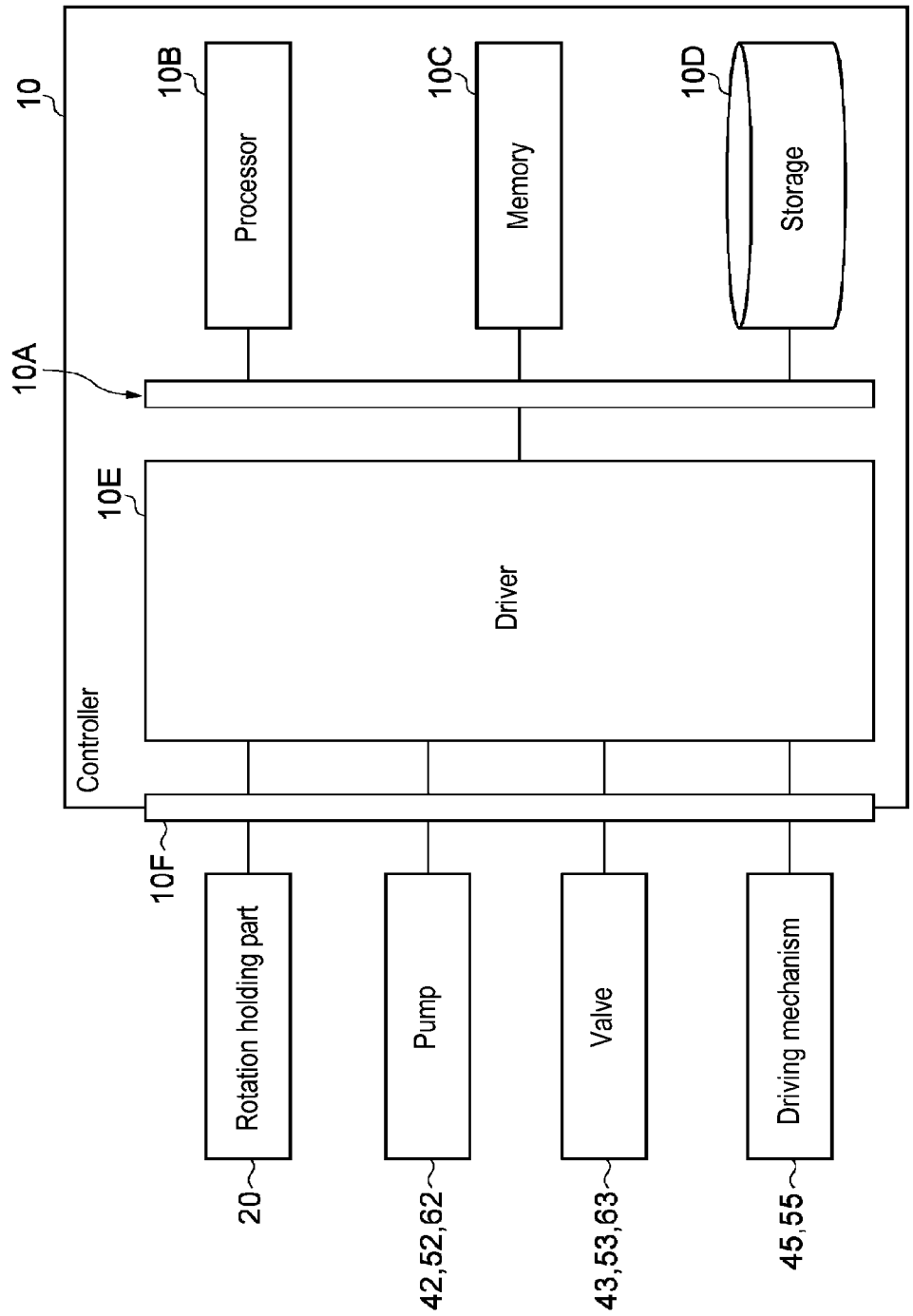
FIG. 6 is a schematic view illustrating a hardware configuration of a controller.

The hardware of the controller 10 is constituted by, for example, one or more control computers. The controller 10 includes, for example, a circuit 10A illustrated in FIG. 6 as a hardware configuration. The circuit 10A may be composed of electric circuit elements (circuitry). Specifically, the circuit 10A includes a processor 10B, a memory 10C (storage part), a storage 10D (storage part), a driver 10E and an input/output port 10F. The processor 10B configures each of the above-mentioned functional modules by executing a program in cooperation with at least one of the memory 10C and the storage 10D and executing input and output operations of signals via the input/output port 10F. The memory 10C and the storage 10D function as the storage part M2.

The driver 10E is a circuit that drives various devices of the substrate processing system 1. The input/output port 10F performs the input and output operations of signals between the driver 10E and the various devices (for example, the rotation holding part 20, the pumps 42, 52 and 62, the valves 43, 53 and 63, the driving mechanisms 45 and 55, etc.) of the substrate processing system 1.

In the present embodiment, the substrate processing system 1 includes a single controller 10. However, the substrate processing system 1 may include a controller group (control part) composed of a plurality of controllers 10. In the case where the substrate processing system 1 includes the controller group, each of the above-described functional modules may be realized by an independent controller 10 or may be realized by a combination of two or more controllers 10. In the case where the controller 10 is composed of a plurality of computers (circuits 10A), each of the above-described functional modules may be realized by a single computer (circuit 10A) or may be realized by a combination of two or more computers (circuits 10A). The controller 10 may include a plurality of processors 10B. In this case, each of the above-described functional modules may be realized by a single processor 10B or may be realized by a combination of two or more processors 10B.

[Wafer Processing Method]

Next, a method (wafer processing method or substrate processing method) of forming the resist film R on the front surface Wa of the wafer W by supplying the coating liquid L1, the organic solvent L2 and the cleaning liquid L3 onto the wafer W. will be described with reference to FIGS. 7 to 10B. First, the controller 10 controls each part of the substrate processing system 1 to transfer the wafer W from the carrier 11 to the liquid treatment unit U1 (see step S11 in FIG. 7).

Subsequently, the controller 10 controls the rotation holding part 20 to hold the wafer W on the holder 23 and rotate the wafer W at a predetermined rotation speed oil (e.g., about 20 rpm to 500 rpm) (see step S12 in FIG. 7). In this state, the controller 10 controls the pump 42, the valve 43 and the driving mechanism 45 to discharge the coating liquid L1 from the nozzle N1 onto the front surface Wa of the wafer W (in a first process; see step S13 in FIG. 7). As a result, the coating liquid L1 slowly spreads along the front surface Wa of the wafer W toward the outer peripheral edge Wc (see FIGS. 8A and 8B).

Subsequently, the controller 10 controls the rotation holding part 20 to rotate the wafer W at a rotation speed ω2 (e.g., about 1,000 rpm to 2,000 rpm) (a first rotation speed) higher than the rotation speed ω1 (in a seventh process; see step S14 in FIG. 7). As a result, the coating liquid L1 starts rapidly spreading along the front surface Wa of the wafer W toward the outer peripheral edge Wc (see FIG. 8C).

Figure 7:
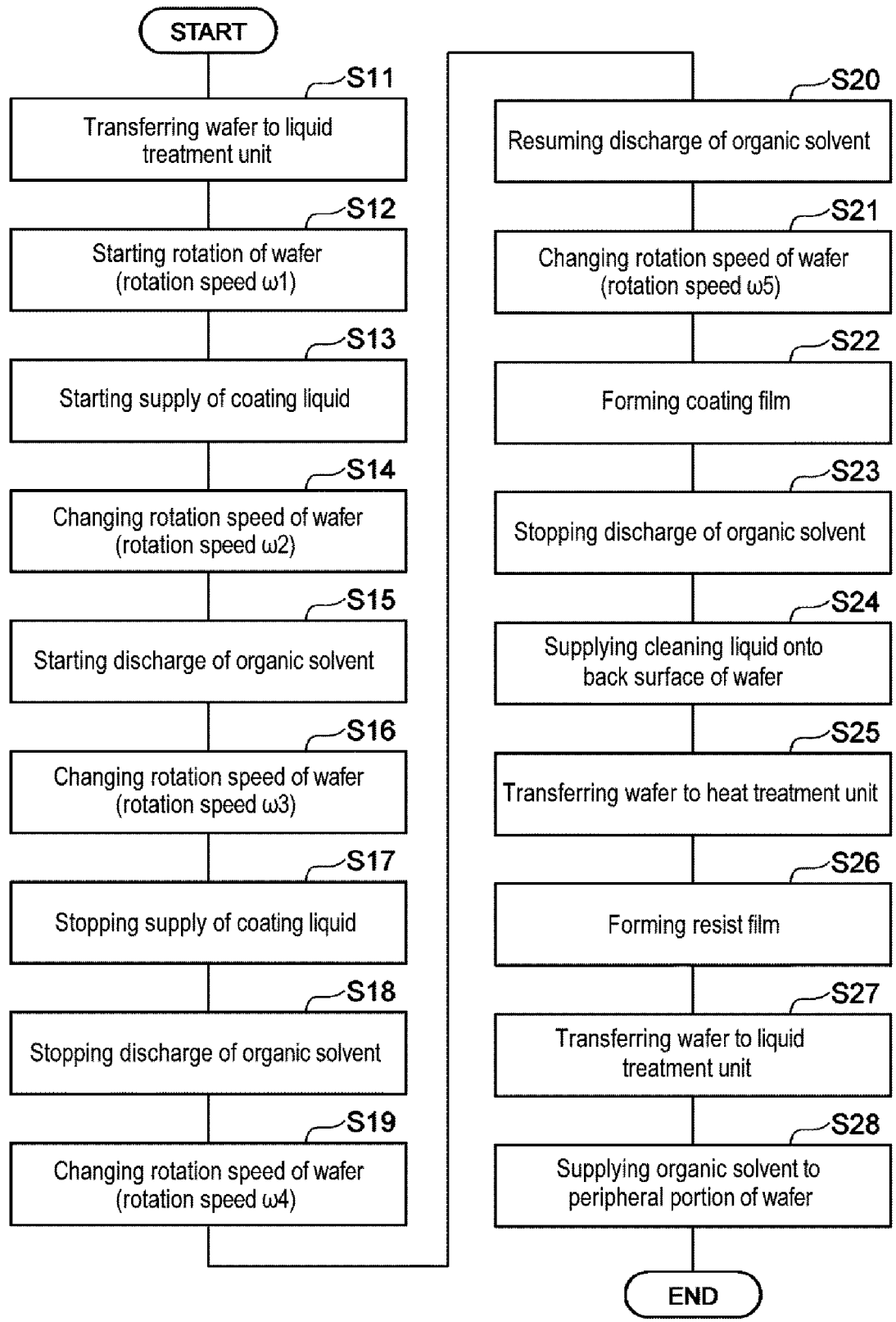
FIG. 7 is a flow chart for explaining a wafer processing procedure.
Figure 8A:
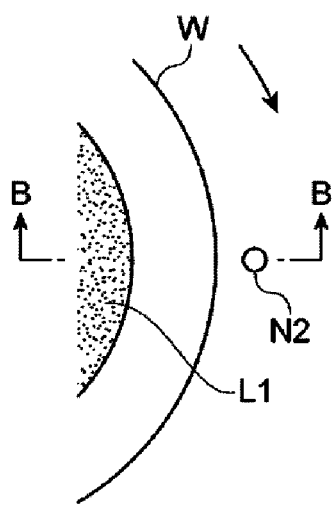
FIGS. 8A to 8D are schematic views for explaining a wafer processing procedure.
Figure 8B:
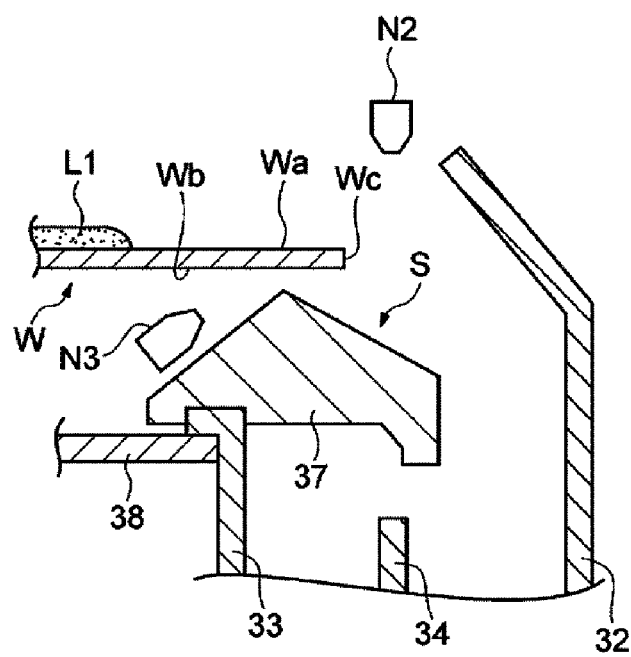
Figure 8C:
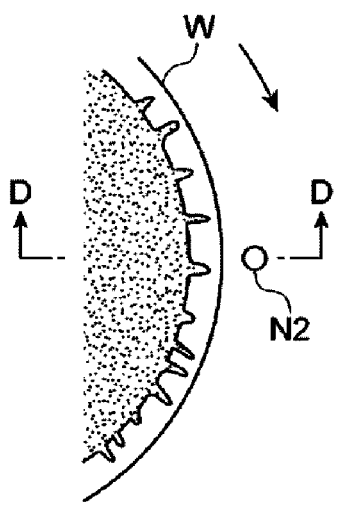
Figure 8D:
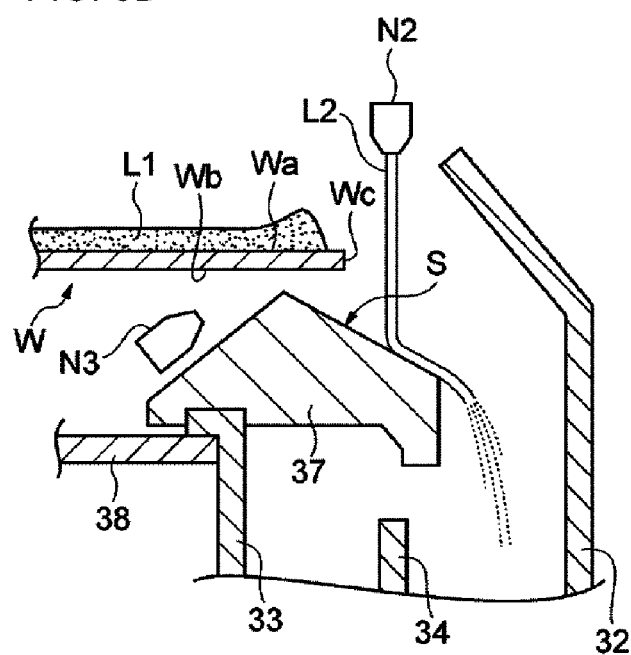
Figure 9A:
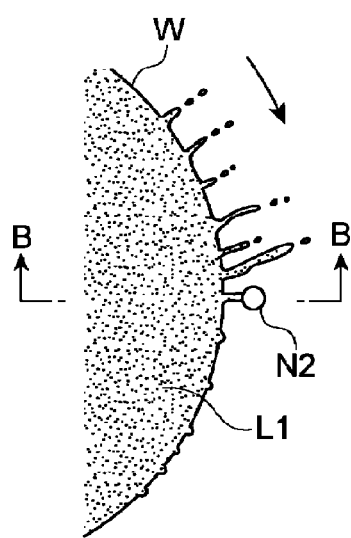
FIGS. 9A to 9D are schematic views for explaining a wafer processing procedure.
Figure 9B:
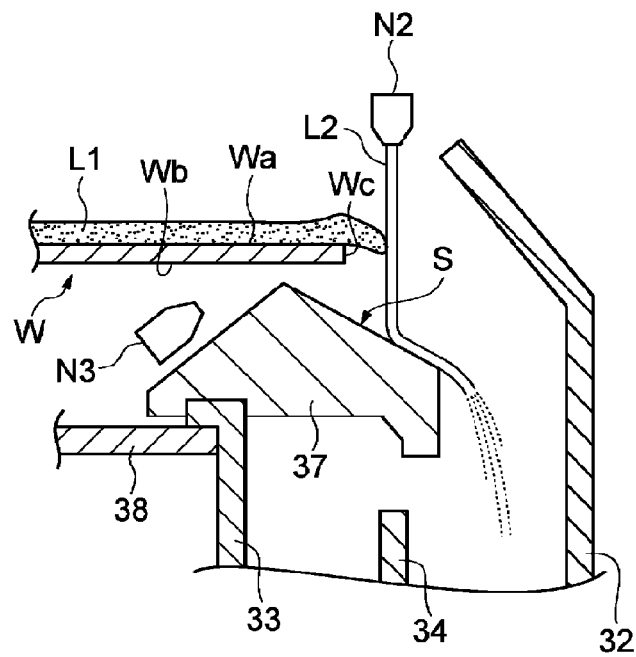
Figure 9C:
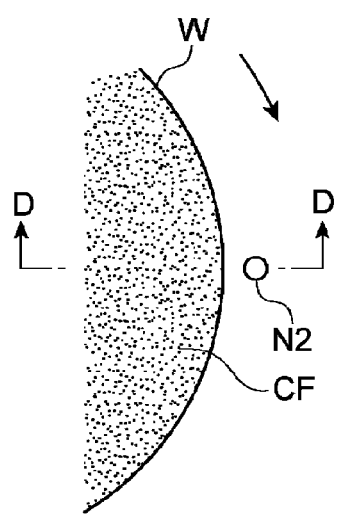
Figure 9D:
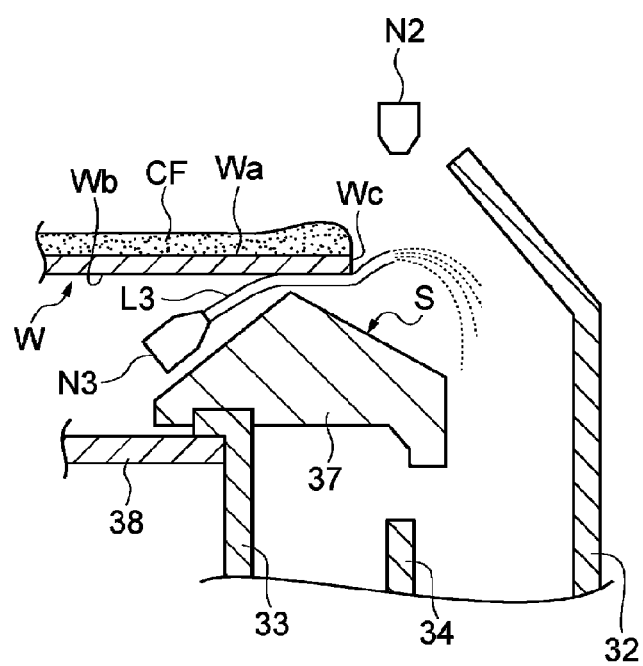

Thereafter, the controller 10 controls the pump 52, the valve 53 and the driving mechanism 55 to discharge the organic solvent L2 from the nozzle N2 downward (into the cup 30) in a state where the nozzle N2 is located outward of the outer peripheral edge Wc of the wafer W when viewed from the rotation axis Ax (in a second process; see step S15 in FIG. 7). A distance between the organic solvent L2 discharged from the nozzle N2 and the outer peripheral edge Wc of the wafer W when viewed from the rotation axis Ax may be greater than at least zero, for example about 5 mm, specifically about 1 mm. As a result, a columnar of the organic solvent L2 is formed between the discharge opening of the nozzle N2 and the inclined surface S of the inclined wall 37 in the vicinity of the outer peripheral edge Wc of the wafer W (see FIG. 8D). In this state, when the coating liquid L1 is dropped from the front surface Wa of the wafer W, the dropped coating liquid L1 collides with the organic solvent L2 so that the dropped coating liquid L1 is blown downward toward the inclined surface S of the inclined wall 37 (see FIGS. 9A and 9B).

Subsequently, the controller 10 controls the rotation holding part 20 to rotate the wafer W at a rotation speed $\omega 3$ (e.g., about 20 rpm to 500 rpm) (a second rotation speed) lower than the rotation speed $\omega 2$ (in an eighth process; see step S16 in FIG. 7). As a result, the coating liquid L1 is gathered to the central portion of the wafer W. Meanwhile, the controller 10 controls the pump 52 and the valve 53 to stop the discharge of the organic solvent L2 from the nozzle N2 (see step S18 in FIG. 17).

Subsequently, the controller 10 controls the rotation holding part 20 to rotate the wafer W at a rotation speed $\omega 4$ (e.g., about 500 rpm to 1,000 rpm) (a third rotation speed) higher than the rotation speed $\omega 3$ (in a ninth process; see step S19 in FIG. 7). At this time, the controller 10 may control the pump 52 and the valve 53 to again discharge the organic solvent L2 from the nozzle N2 (in the second process; see step S20 in FIG. 7). As a result, the coating liquid L1 starts rapidly spreading again along the front surface Wa of the wafer W toward the outer peripheral edge Wc. The coating liquid L1 dropped from the surface Wa of the wafer W collides with the organic solvent L2 and is blown downward toward the inclined surface S of the inclined wall 37 (see FIGS. 9A and 9B). Thus, the coating liquid L1 spreads substantially uniformly over the entire surface Wa of the wafer W.

Subsequently, the controller 10 controls the rotation holding part 20 to rotate the wafer W at a rotation speed $\omega 5$ (e.g., about 1,000 rpm to 1,500 rpm) higher than the rotation speed $\omega 4$ (see step S21 in FIG. 7). As a result, the coating liquid L1 is dried and gelled to form a coating film CF on the front surface Wa of the wafer W (in a third process; see step S22 of FIG. 7, and FIGS. 9C and 9D). Thereafter, the controller 10 controls the pump 52 and the valve 53 to stop the discharge of the organic solvent L2 from the nozzle N2 (see step S23 in FIG. 7).

Subsequently, the controller 10 controls the pump 62 and the valve 63 to supply the cleaning liquid L3 from the nozzle N3 onto the back surface Wb of the wafer W and toward the vicinity of the outer peripheral edge Wc (in a fourth process; see step S24 in FIG. 7). The cleaning liquid L3 that reached the outer peripheral edge Wc flows further outward while slightly going around the outer peripheral edge Wc. At this time, a portion of the coating film CF that seeps out from the outer peripheral edge Wc is removed by the cleaning liquid L3 (see FIGS. 9C and 9D).

Subsequently, the controller 10 controls each part of the substrate processing system 1 to transfer the wafer W from the liquid treatment unit U1 to the heat treatment unit U2 (see step S25 in FIG. 7). Thereafter, the controller 10 controls the heat treatment unit U2 to heat the coating film CF together with the wafer W. As a result, the resist film R, which is a solidified form of the coating film CF, is formed (in a fifth process; see step S26 in FIG. 7). At this time, such a heating treatment may be performed at a predetermined temperature (e.g., about 120 degrees C.) for a predetermined time (about 180 seconds). In this way, the processing of the wafer W is completed, and the resist film R is formed on the front surface Wa of the wafer W.

Subsequently, the controller 10 controls each part of the substrate processing system 1 to transfer the wafer W from the heat treatment unit U2 to the liquid treatment unit U1 (see step S27 in FIG. 7). Subsequently, the controller 10 controls the rotation holding part 20 to rotate the wafer W at a predetermined rotation speed (e.g., about 200 rpm). Further, the controller 10 controls the pump 52, the valve 53 and the driving mechanism 55 to discharge the organic solvent L2 from the nozzle N2 downward (toward the peripheral edge portion of the wafer W) in a state where the nozzle N2 is located above the peripheral edge portion of the wafer W when viewed from the rotation axis Ax (in a sixth process; see step S28 in FIG. 7).

In step S28 in FIG. 7, the nozzle N2 may be positioned in a posture in which the discharge opening of the nozzle N2 is oriented vertically downward with respect to the front surface Wa of the wafer W or in which the discharge opening is inclined obliquely downward from the central portion of the wafer W toward the peripheral portion thereof. In this case, the organic solvent L2 supplied onto the peripheral edge portion of the resist film R hardly splashes toward the central portion of the wafer W. Therefore, it is easy to secure the in-plane uniformity of the resist film R formed as a result of the processing of the wafer W.

[Operation]

Figure 11A:
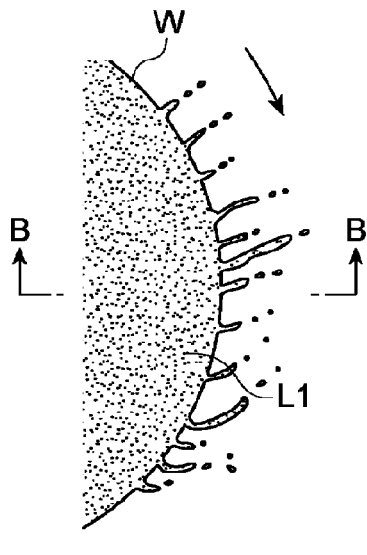
FIGS. 11A to 11D are schematic views for explaining a state in which a floc is formed on a back surface of a wafer.
Figure 11B:
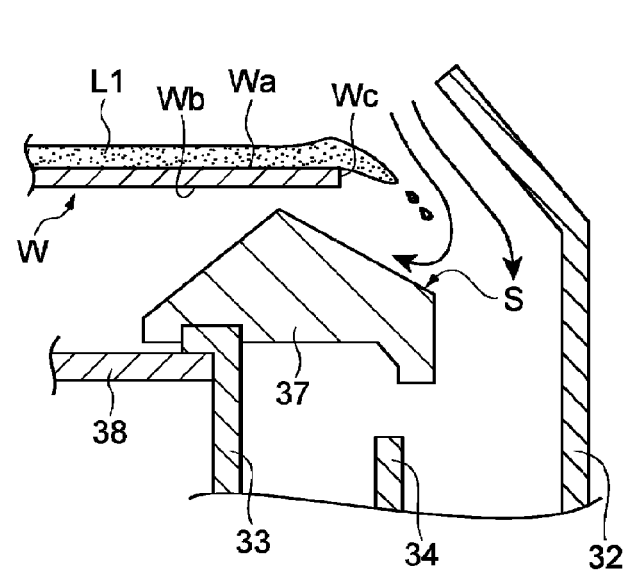
Figure 11C:
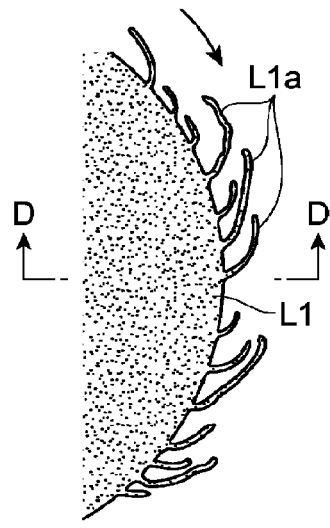
Figure 11D:
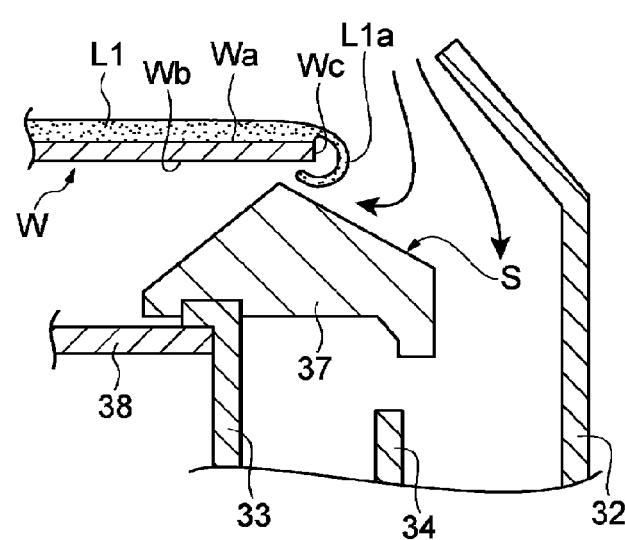
Figure 12A:
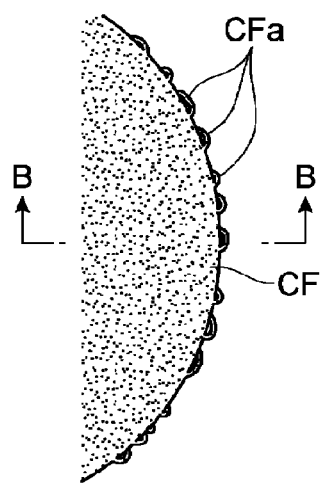
FIGS. 12A and 12B are schematic views for explaining how a floc is formed on the back surface of a wafer.
Figure 12B:
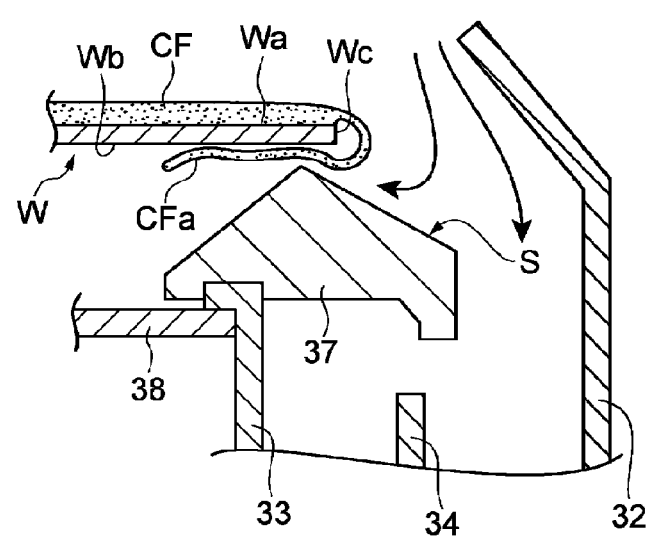

Incidentally, if the coating liquid L1 is dropped onto the front surface Wa of the wafer W and the coating liquid L1 is spin-coated on the wafer W in a state where the wafer W is being rotated at a high speed of a certain level, the entire surface Wa of the wafer W is coated with the coating liquid L1, which increases the uniformity of the film thickness of the coating film CF. However, since most of the coating liquid L1 is dropped outward from the outer peripheral edge Wc of the wafer W, it becomes difficult to make the film thickness of the formed coating film F a desired magnitude. On the other hand, in order to obtain a resist film R having a large film thickness, the coating liquid L1 is dropped onto the front surface Wa of the wafer W and is spin-coated on the wafer W in a state where the wafer W is being rotated at a low speed of a certain level. At this time, some of the coating liquid L1 is dropped from the outer peripheral edge Wc of the wafer W (see FIGS. 11A and 11B). Since the coating liquid L1 has a high viscosity, a portion of the coating liquid L1 dropped from the outer peripheral edge Wc of the wafer W is stretched in the form of a string from the outer peripheral edge Wc to become a string-like portion L1$a$ (see FIGS. 11C and 11D). At this time, an airflow going around to the back surface Wb of the wafer W may occur around the wafer W, and the string-like portion L1$a$ may also go around to the back surface Wb due to the influence of the airflow (see FIGS. 11C and 11D). As the wafer W is further rotated, the string-like portion L1$a$ further extends while the coating liquid L1 and the string-like portion L1$a$ are being gradually dried and gelled, thereby forming a gelled string-like portion CF$a$ (see FIGS. 12A and 12B). A length of the gelled string-like portion CF$a$ may be about 10 mm at maximum. The gelled string-like portions CF$a$ are entangled with each other on the back surface Wb side of the wafer W to form a floc (see FIGS. 12A and 12B).

However, in the present embodiment as described above, the controller 10 controls the solvent supply part 50 to discharge the organic solvent L2 downward from the nozzle N2 outside the outer peripheral edge Wc of the wafer W before the coating liquid L1 reaches the outer peripheral edge Wc by virtue of the centrifugal force generated by the rotation of the wafer W. Therefore, even when the coating liquid L1 reaches the outer peripheral edge Wc of the wafer W and is dropped from the outer peripheral edge Wc, the dropped coating liquid L1 collides with the organic solvent L2 discharged from the nozzle N2, and is blown off and then flows downward. That is to say, the organic solvent L2 discharged from the nozzle N2 exerts the function of cutting off the dropped coating liquid L1. In this way, since the dropped coating liquid L1 is cut with the organic solvent L2 before it becomes the string-like portion L1a, the dropped coating liquid L1 hardly goes around to the side of the back surface Wb of the wafer W. Therefore, it is possible to suppress the occurrence of floc.

In the present embodiment, after the coating liquid L1 is supplied onto the front surface Wa of the wafer W, the organic solvent L2 is discharged from the nozzle N2 (see steps S13 and S15 in FIG. 7). Therefore, the discharge of the organic solvent L2 is limited to such an extent that the coating liquid L1 cannot be dropped from the wafer W. This makes it possible to restrict use of the organic solvent L2.

In the present embodiment, after the coating film CF is formed on the front surface Wa of the wafer W, the cleaning liquid is discharged from the nozzle N3 toward the outer peripheral edge Wc of the back surface Wb of the wafer W (see steps S22 and S24 in FIG. 7). Therefore, even if a portion of the coating film CF slightly seeps out from the outer peripheral edge Wc of the wafer W, the seeped portion is removed at the side of the back surface Wb by the cleaning liquid supplied from the nozzle N3. Accordingly, it is possible to form, on the front surface Wa of the wafer W, the coating film CF having a more uniform shape corresponding to an outer shape of the wafer W.

In the present embodiment, after the resist film R is formed by the solidification of the coating film CF in the heat treatment unit U2, the organic solvent L2 is discharged from the nozzle N2 onto the peripheral portion of the front surface Wa of the wafer W. Therefore, bumps that may occur at the peripheral portion of the wafer W are removed by the organic solvent L2. Moreover, such a bump removing process and a process of cutting the coating liquid L1 dropped from the wafer W are performed by the single nozzle N2. Accordingly, since the nozzle N2 has these plural functions, it is possible to make the apparatus compact.

In the present embodiment, a distance between the organic solvent L2 discharged from the nozzle N2 and the outer peripheral edge Wc of the wafer W can be set to 0.5 mm or more when viewed from the direction of extension of the rotation axis Ax. In this case, even if a deviation occurs in the holding position of the wafer W, the organic solvent L2 discharged from the nozzle N2 is hardly supplied onto the wafer W.

In the present embodiment, the wafer W is rotated at the rotation speed ω2 to spread the coating liquid L1 supplied onto the wafer W toward the outer peripheral edge Wc, and the organic solvent L2 is discharged downward from the nozzle N2 outside the outer peripheral edge Wc. Subsequently, the wafer W is rotated at the rotation speed ω3 lower than the rotation speed ω2 to gather the coating liquid L1 to the central portion of the wafer W, and the discharge of the organic solvent L2 from the nozzle N2 is stopped. Subsequently, the wafer W is rotated at the rotational speed ω4 higher than the rotational speed ω3 to again spread the coating liquid L1 toward the outer peripheral edge Wc, and the organic solvent L2 is again discharged downward from the nozzle N2 outside the outer peripheral edge Wc. Therefore, the coating liquid L1 spreads to some extent along the front surface Wa of the wafer W with the rotation of the wafer W at the rotation speed ω2. Thus, when the wafer W is rotated at the rotation speed ω4, the coating liquid L1 spreads over the front surface Wa of the wafer W while sliding over the coating liquid L1 existing on the front surface Wa of the wafer W. Accordingly, the coating liquid L1 easily spreads over the entire front surface Wa of the wafer W, and a film thickness of the coating film CF formed on the front surface Wa of the wafer W is easily made uniform. In addition, the organic solvent L2 is not discharged from the nozzle N2 when the coating liquid L1 is gathered to the central portion from the wafer W. Thus, the discharge of the organic solvent L2 is limited to such an extent that the coating liquid L1 cannot be dropped. This makes it possible to reduce the amount of the organic solvent L2 used.

In the present embodiment, the coating liquid L1 having a viscosity of 2,000 cP or more may be used. In this case, particularly, even with the use of a high-viscosity coating liquid L1 in which a floc tends to occur, it is possible to suppress the occurrence of the floc.

[Modification]

Although the embodiment according to the present disclosure has been described in detail above, various modifications may be added to the above embodiment without departing from the spirit and scope of the present disclosure. For example, the discharge of the organic solvent L2 from the nozzle N2 may be started before the coating liquid L1 is dropped from the front surface Wa of the wafer W.

The process of supplying the cleaning liquid onto the back surface Wb of the wafer W may not be executed. In this case, the liquid treatment unit U1 may not include the cleaning liquid supply part 60.

In the above embodiment, the organic solvent L2 is discharged onto the peripheral portion of the resist film R after the coating film CF is solidified by the heat treatment performed by the heat treatment unit U2. However, the organic solvent L2 may be discharged onto the peripheral portion of the coating film CF before solidification.

In the above embodiment, the wafer W is initially rotated at a relatively low speed to gather the coating liquid L1 to the central portion of the wafer W, and subsequently, the discharge of the organic solvent L2 is stopped (see steps S14, S16 and S19 in FIG. 7). However, the process of gathering the coating liquid L1 to the central portion of the wafer W may be omitted. In this case, the organic solvent L2 may be continuously discharged from the nozzle N2.

The solvent supply part 50 may have one or more nozzles N2. In the case where the solvent supply part 50 has a plurality of nozzles N2, the plurality of nozzles N2 may be installed so as to be aligned along the outer peripheral edge Wc outside the outer peripheral edge Wc of the wafer W. Intervals between adjacent nozzles N2 in the direction along the outer peripheral edge Wc may be approximately equal to each other. This makes it possible to efficiently cut the coating liquid L1 dropped from the front surface Wa of the wafer W.

The discharge opening of the nozzle N2 may have an annular shape corresponding to the outer peripheral edge Wc of the wafer W. A plurality of nozzles N2 having slit-shaped discharge openings formed therein may be arranged along the outer peripheral edge Wc of the wafer W. The discharge openings of the plurality of nozzles N2 may be arranged in an annular shape as a whole. Even in such a case, it is possible to efficiently cut the coating liquid L1 dropped from the front surface Wa of the wafer W.

According to the substrate processing apparatus, the substrate processing method and the computer-readable recording medium of the present disclosure in some embodiments, it is possible to suppress occurrence of a floc.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
rotating the substrate at a predetermined rotation speed around a rotation axis which extends in a direction perpendicular to a front surface of the substrate and supplying a processing liquid onto the front surface from a processing liquid nozzle located above the substrate, wherein the processing liquid is supplied for forming a solidified processing film on the front surface of the substrate;
discharging an organic solvent downward from a discharge nozzle located above the substrate outside an outer peripheral edge of the substrate, before the processing liquid reaches the outer peripheral edge of the substrate by virtue of a centrifugal force generated with the rotation of the substrate; and
cutting off the processing liquid dropped from the outer peripheral edge by colliding it with the organic solvent discharged from the discharge nozzle, after the processing liquid reaches the outer peripheral edge of the substrate by virtue of the centrifugal force,
wherein, in the discharging the organic solvent downward from the discharge nozzle, a distance between the organic solvent discharged from the discharge nozzle and the outer peripheral edge of the substrate is set to 0.5 mm or more when viewed from the extension direction of the rotation axis and the distance is outside the outer peripheral edge of the substrate.

2. The method of claim 1, wherein the discharging the organic solvent downward from the discharge nozzle is performed after the processing liquid is supplied onto the front surface of the substrate.

3. The method of claim 1, further comprising:
forming a processing film on the front surface of the substrate by supplying the processing liquid on the entire front surface of the substrate, and subsequently, rotating the substrate around the rotation axis to dry the processing film; and
subsequently, supplying a cleaning liquid toward the outer peripheral edge of a back surface of the substrate from a cleaning liquid nozzle located in proximity of the back surface of the substrate.

4. The method of claim 1, further comprising:
forming a processing film on the front surface of the substrate by supplying the processing liquid on the entire front surface of the substrate, and subsequently, heating the substrate by a heating part and solidifying the processing film to form a solidified film; and
supplying the organic solvent onto a peripheral portion of the solidified film from the discharge nozzle and melting the peripheral portion to remove the peripheral portion of the solidified film from the substrate.

5. The method of claim 1, further comprising:
after the supplying the processing liquid onto the front surface from the processing liquid nozzle,
rotating the substrate at a first rotation speed to spread the processing liquid toward the outer peripheral edge of the substrate and discharging the organic solvent downward from the discharge nozzle outside the outer peripheral edge of the substrate;
rotating the substrate at a second rotation speed lower than the first rotation speed to gather the processing liquid to a central portion of the substrate; and
rotating the substrate at a third rotation speed higher than the second rotation speed to again spread the processing liquid toward the outer peripheral edge of the substrate and discharging the organic solvent downward from the discharge nozzle outside the outer peripheral edge of the substrate.

6. The method of claim 1, wherein a viscosity of the processing liquid is 2,000 cP or more.

* * * * *